(12) United States Patent
Cho et al.

(10) Patent No.: US 8,159,824 B2
(45) Date of Patent: Apr. 17, 2012

(54) PRINTED CIRCUIT BOARD

(75) Inventors: Han-Seo Cho, Daejeon (KR);
Je-Gwang Yoo, Yongin-si (KR);
Joon-Sung Kim, Suwon-si (KR);
Sang-Hoon Kim, Gunpo-si (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 731 days.

(21) Appl. No.: 12/230,700

(22) Filed: Sep. 3, 2008

(65) Prior Publication Data

US 2009/0084584 A1 Apr. 2, 2009

(30) Foreign Application Priority Data

Sep. 28, 2007 (KR) ................. 10-2007-0098385

(51) Int. Cl.
*H05K 1/00* (2006.01)

(52) U.S. Cl. ........ 361/751; 361/749; 361/760; 361/783; 361/792; 174/260; 257/98; 385/14

(58) Field of Classification Search .................. 361/736, 361/749, 750, 751, 760, 767, 783, 790, 792, 361/808–810
See application file for complete search history.

(56) References Cited

U.S. PATENT DOCUMENTS

| 6,477,286 | B1 * | 11/2002 | Ouchi | 385/14 |
| 7,851,816 | B2 * | 12/2010 | Dutta | 257/98 |
| 2005/0058389 | A1 * | 3/2005 | Ouchi | 385/14 |
| 2006/0029326 | A1 * | 2/2006 | Ouchi | 385/14 |
| 2008/0247706 | A1 * | 10/2008 | Dellmann et al. | 385/14 |
| 2008/0285910 | A1 * | 11/2008 | Yamada et al. | 385/14 |
| 2009/0103860 | A1 * | 4/2009 | Kim et al. | 385/14 |

FOREIGN PATENT DOCUMENTS

| JP | 2002-277694 | 9/2002 |
| JP | 2003-227951 | 8/2003 |
| JP | 2005-37531 | 2/2005 |
| JP | 2006-140233 | 6/2006 |
| JP | 2006-284867 | 10/2006 |

OTHER PUBLICATIONS

Japanese Office Action issued on Nov. 16, 2010 in corresponding Japanese Patent Application 2008-220259.
Japanese Office Action issued Aug. 16, 2011 in corresponding Japanese Patent Application 2008-220259.

* cited by examiner

*Primary Examiner* — Courtney Smith

(57) ABSTRACT

A printed circuit board is disclosed. The printed circuit board includes a first board unit and a second board unit disposed with a gap in-between, and a flexible optical board configured to transmit optical signals, which has one side stacked on the first board unit and the other side stacked on the second board unit, where the flexible optical board includes a core through which the optical signals travel, a cladding surrounding the core, and a circuit pattern buried in the cladding which transmits electrical signals. By forming the rigid boards and the flexible optical board as an integrated structure, the need for separate connectors is obviated, and thus the cost of the product can be lowered.

4 Claims, 7 Drawing Sheets

PRINTED CIRCUIT BOARD

CROSS-REFERENCE TO RELATED APPLICATIONS

This application claims the benefit of Korean Patent Application No. 10-2007-0098385 filed with the Korean Intellectual Property Office on Sep. 28, 2007, the disclosure of which is incorporated herein by reference in its entirety.

BACKGROUND

1. Technical Field

The present invention relates to a printed circuit board.

2. Description of the Related Art

A rigid-flexible printed circuit board is in wide use in network equipment and mobile electronic products such as cell phones, etc. In mobile electronic products, in particular, there is a high demand for printed circuit boards having flexibility, since maneuverability is required in folders, sliders, or even more complicated structures.

In contrast to boards using electrical wiring, boards that use optical signals are unaffected by EMI (electromagnetic interference) and EMC (electromagnetic compatibility), so that they may be more resistant to external noise and may not require the use of grounds or differential wiring. There may also be the advantage of enabling the transfer of high-speed signals, due to low loss.

A printed circuit board according to the related art, structured to have a flexible optical board connecting rigid boards, is illustrated in FIG. 1.

In the case of the printed circuit board according to the related art, separate connectors 4 may be required, as illustrated in FIG. 1, for connecting the flexible optical board 3 with the rigid boards 1, 2, and consequently, an additional process may be required for attaching the connectors 4 to the flexible optical board 3 or the rigid boards 1, 2.

SUMMARY

An aspect of the invention is to provide a printed circuit board, in which rigid boards and a flexible optical board may be formed as an integrated structure.

One aspect of the invention provides a printed circuit board that includes a first board unit and a second board unit disposed with a gap in-between; a flexible optical board configured to transmit optical signals, which has one side stacked on the first board unit and the other side stacked on the second board unit; and a flexible electrical board configured to transmit electrical signals, which has one side stacked on the first board unit and the other side stacked on the second board unit.

The flexible optical board and the flexible electrical board can be disposed with a gap in-between.

The flexible optical board may include a core, through which optical signals may travel, and a cladding, which surrounds the core, and a circuit pattern capable of transmitting electrical signals can be buried in the cladding.

Here, the flexible optical board can be stacked on an outermost portion of the first board unit, with portions of the circuit pattern exposed at the surface of the cladding.

Photoelectric converters may be mounted directly on the flexible optical board, in which case the cladding can be made of a transparent material.

Another aspect of the invention provides a printed circuit board that includes a first board unit and a second board unit disposed with a gap in-between, and a flexible optical board configured to transmit optical signals, which has one side stacked on the, first board unit and the other side stacked on the second board unit, where the flexible optical board includes a core through which the optical signals travel, a cladding surrounding the core, and a circuit pattern buried in the cladding which transmits electrical signals.

The flexible optical board can be stacked on an outermost portion of the first board unit, and a portion of the circuit pattern can be exposed at a surface of the cladding. A photoelectric converter may mounted on the flexible optical board, in which case the cladding can be made of a transparent material.

Additional aspects and advantages of the present invention will be set forth in part in the description which follows, and in part will be obvious from the description, or may be learned by practice of the invention.

DETAILED DESCRIPTION

Figure 1:
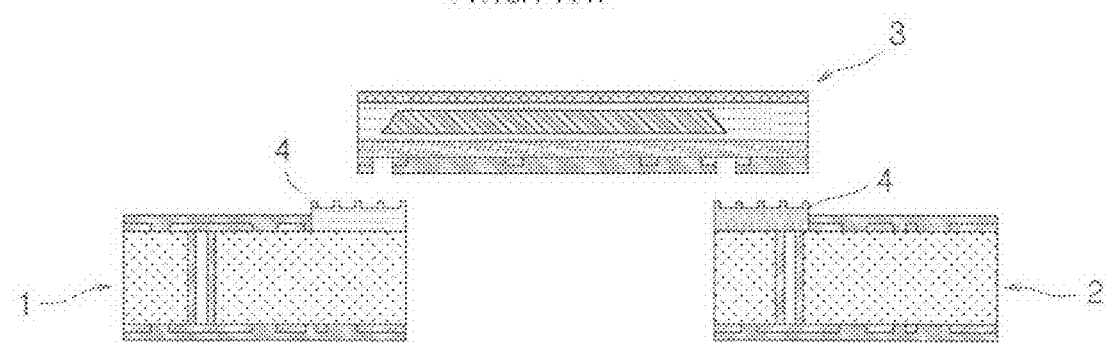
FIG. 1 is a cross-sectional view illustrating a printed circuit board according to the related art.

As the invention allows for various changes and numerous embodiments, particular embodiments will be illustrated in drawings and described in detail in the written description. However, this is not intended to limit the present invention to particular modes of practice, and it is to be appreciated that all changes, equivalents, and substitutes that do not depart from the spirit and technical scope of the present invention are encompassed in the present invention. In the description of the present invention, certain detailed explanations of related art are omitted when it is deemed that they may unnecessarily obscure the essence of the invention.

While such terms as "first," "second," etc., may be used to describe various elements, such elements must not be limited to the above terms. The above terms are used only to distinguish one element from another.

The terms used in the present application are merely used to describe particular embodiments, and are not intended to limit the present invention. An expression used in the singular encompasses the expression of the plural, unless it has a clearly different meaning in the context. In the present application, it is to be understood that the terms such as "including" or "having," etc., are intended to indicate the existence of the features, numbers, steps, actions, elements, parts, or combinations thereof disclosed in the specification, and are not intended to preclude the possibility that one or more other features, numbers, steps, actions, elements, parts, or combinations thereof may exist or may be added.

The printed circuit board according to certain embodiments of the invention will be described below in more detail with reference to the accompanying drawings. Those components that are the same or are in correspondence are rendered the same reference numeral regardless of the figure number, and redundant explanations are omitted.

Figure 2:
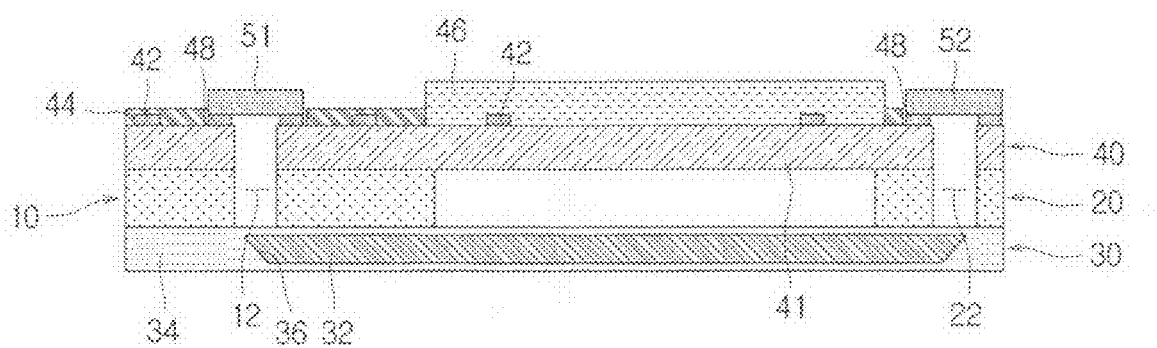
FIG. 2 is a cross-sectional view illustrating a printed circuit board according to a first disclosed embodiment of the invention.

FIG. 2 is a cross-sectional view illustrating a printed circuit board according to a first disclosed embodiment of the invention. In FIG. 2, there are illustrated a first board unit 10, holes 12, 22, a second board unit 20, a flexible optical board 30, a core 32, a cladding 34, reflective surfaces 36, a flexible electrical board 40, an insulation layer 41, a circuit pattern 42, solder resists 44, a cover lay 46, pads 48, and photoelectric converters 51, 52.

In the printed circuit board according to this embodiment, a first board unit 10 and a second board unit 20 having rigidity may be positioned each at either end, and may be connected to each other by way of a flexible optical board 30 and a flexible electrical board 40. That is, as illustrated in FIG. 2, both ends of each of the flexible optical board 30 and the flexible electrical board 40 can be stacked on the first board unit 10 and second board unit 20, to form an integrated structure.

Using a cell phone as an example, the first board unit 10 may be equipped in the main body of the cell phone, while the second board unit 20 may be equipped in the display part. The first board unit 10 and the second board unit 20 can each be a circuit board having a single layer or a circuit board having multiple layers. The first board unit 10 and the second board unit 20 may exchange signals by way of the flexible optical board 30 and flexible electrical board 40, etc., which will be described below in more detail.

The flexible optical board 30 can be made of a flexible material having high bendability, and can include a core 32, and a cladding 34 surrounding the core 32, to be capable of transmitting optical signals.

The core 32 can be made of a polymer material or an optical fiber material. In the example provided for this particular embodiment, a core 32 of a polymer material is presented, which has superb flexibility and which can be advantageous in miniaturizing the structure for connecting to the photoelectric converters 51, 52. An example of such material includes polyimide (PI). At either end of the core 32, reflective surfaces 36 may be formed that are capable of refracting the optical signals.

The cladding 34 may surround the core 32 and may be designed to allow the efficient transmission of optical signals. Similar to the core 32, the cladding 34 can be made of a polymer material having high flexibility. However, for the efficient transmission of optical signals, the refractive index of the cladding 34 can be designed to be lower than that the refractive index of the core 32. One method of achieving this can include applying an additive for adjusting the refractive index to the same polymer material as that used for the core 32. Of course, the core 32 and the cladding 34 can also be formed from different materials.

While this particular embodiment presents the case of using a flexible optical board 30 equipped with a core 32 and cladding 34, it is to be appreciated that optical fibers can also be used in forming the flexible optical board 30.

The flexible electrical board 40 can be composed of an insulation 41, made of a flexible material that allows high bendability, such as polyimide, and a pre-designed circuit pattern 42, etc., formed on one side of such insulation 41. The circuit pattern 42 formed on the flexible electrical board 40 can be covered and protected by solder resists 44 and a cover lay 46.

As illustrated in FIG. 2, portions of the circuit pattern 42 formed on the flexible electrical board 40 may function as pads 48, to allow the mounting of photoelectric converters 51, 52. By way of these pads 48, the photoelectric converters 51, 52 and the circuit pattern 42 can be electrically connected.

Also, in order to secure the paths for optical signals from the photoelectric converters 51, 52 to the core 32, holes 12, 22 may be formed in the first board unit 10 and second board unit 20. Such holes 12, 22 can be omitted if the first board unit 10 and second board unit 20 are made from transparent materials.

As illustrated in FIG. 2, the flexible optical board 30 and the flexible electrical board 40 can be disposed with a gap in-between. With the flexible optical board 30 and the flexible electrical board 40 separated by way of the first board unit 10 and/or second board unit 20, etc., interference between the flexible optical board 30 and the flexible electrical board 40 can be reduced, whereby greater bendability may be obtained.

The photoelectric converters 51, 52 may serve to convert electrical signals to optical signals or convert optical signals to electrical signals. These photoelectric converters 51, 52 and the flexible optical board 30 can be used to implement high-speed signal transfers between the first board unit 10 and the second board unit 20. According to the embodiment described above, a printed circuit board is provided in which the first board unit 10 and second board unit 20 having rigidity and the flexible optical board 30 and flexible electrical board 40 having flexibility can be formed as an integrated structure. In the case of such printed circuit board, the manufacturing process can be simplified, because processes related to the fabrication of connectors can be omitted, and the electrical connections can be implemented with greater reliability.

Furthermore, by having the flexible optical board 30 and the flexible electrical board 40 separated from each other, a greater degree of bendability can be obtained.

Figure 3:
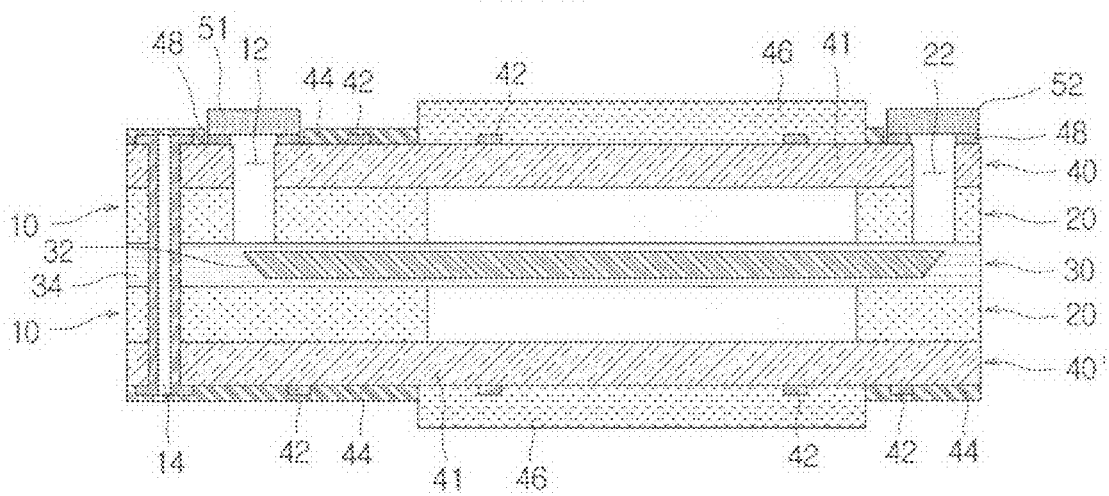
FIG. 3 is a cross-sectional view illustrating a printed circuit board according to a second disclosed embodiment of the invention.
Figure 4:
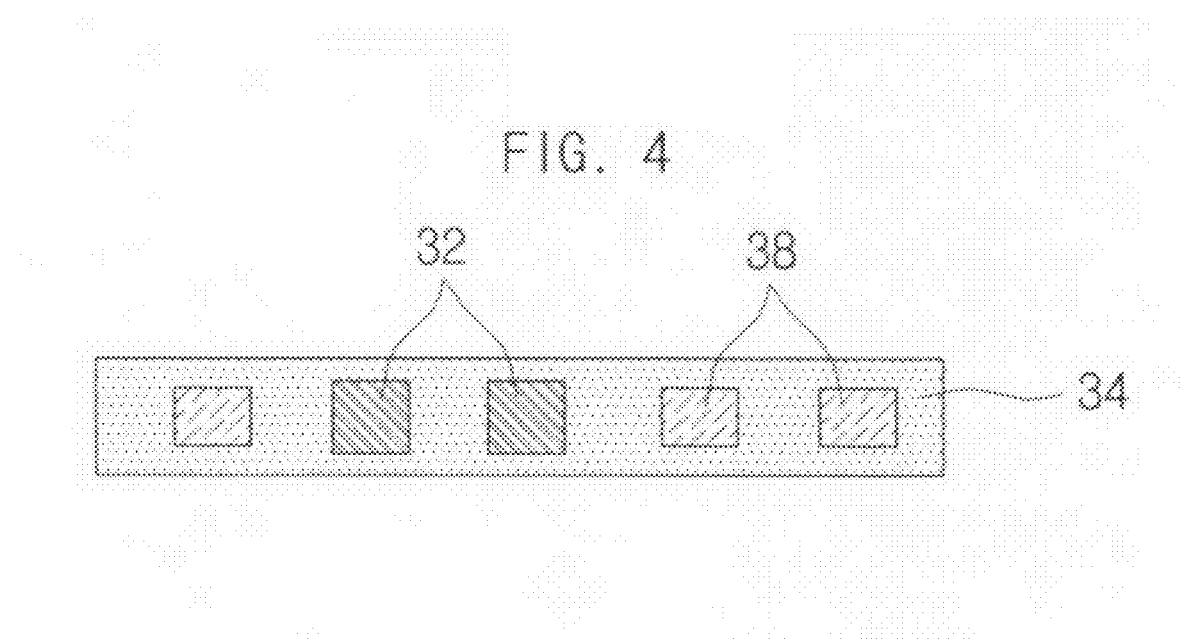
FIG. 4 is a cross-sectional view illustrating the flexible optical board from FIG. 3.

Next, a printed circuit board according to a second disclosed embodiment of the invention will be described as follows. FIG. 3 is a cross-sectional view illustrating a printed circuit board according to the second disclosed embodiment of the invention, and FIG. 4 is a cross-sectional view illustrating the flexible optical board from FIG. 3. In FIGS. 3 and 4 are illustrated a first board unit 10, holes 12, 22, a via 14, a second board unit 20, a flexible optical board 30, cores 32, a cladding 34, circuit patterns 38, 42, flexible electrical boards 40, 40', an insulation layer 41, solder resists 44, cover lays 46, pads 48, and photoelectric converters 51, 52.

Detailed descriptions will not repeated for components that are substantially the same as those in the first disclosed embodiment, with the descriptions focusing mostly on different components.

In the printed circuit board according to this embodiment, the flexible electrical boards 40, 40' may be formed in a plurality. The printed circuit board can be structured to have one side of the flexible optical board 30 inserted into an intermediate portion of a first board unit 10 and the other side of the flexible optical board 30 inserted into an intermediate portion of a second board unit 20.

In other words, in cases where the first board unit 10 and the second board unit 20 are multi-layered circuit boards, the flexible optical board 30 can be inserted and stacked in intermediate portions of the first board unit 10 and second board unit 20, while the flexible electrical boards 40, 40' can each be stacked on the uppermost and lowermost layers of the first board unit 10 and second board unit 20.

Here, each layer of the first board unit 10 can be electrically connected with one another by way of a via 14. The same applies for the second board unit 20.

In some cases, as illustrated in FIG. 4, a printed circuit board according to this embodiment can have a circuit pattern 38 for transmitting electrical signals formed in the cladding 34 that constitutes a part of the flexible optical board 30. That is, independently of the circuit patterns 42 formed on the flexible electrical boards 40, 40', a circuit pattern 38 can be formed in the flexible optical board 30, for a wider range of options in choosing paths for signals. FIG. 4 illustrates a structure in which cores 32 and circuit patterns 38 are buried together in the cladding 34.

It is to be appreciated that such a structure, which has a circuit pattern 38 buried in the flexible optical board 30, can be applied not only to this embodiment but also to the first disclosed embodiment described above.

Figure 5:
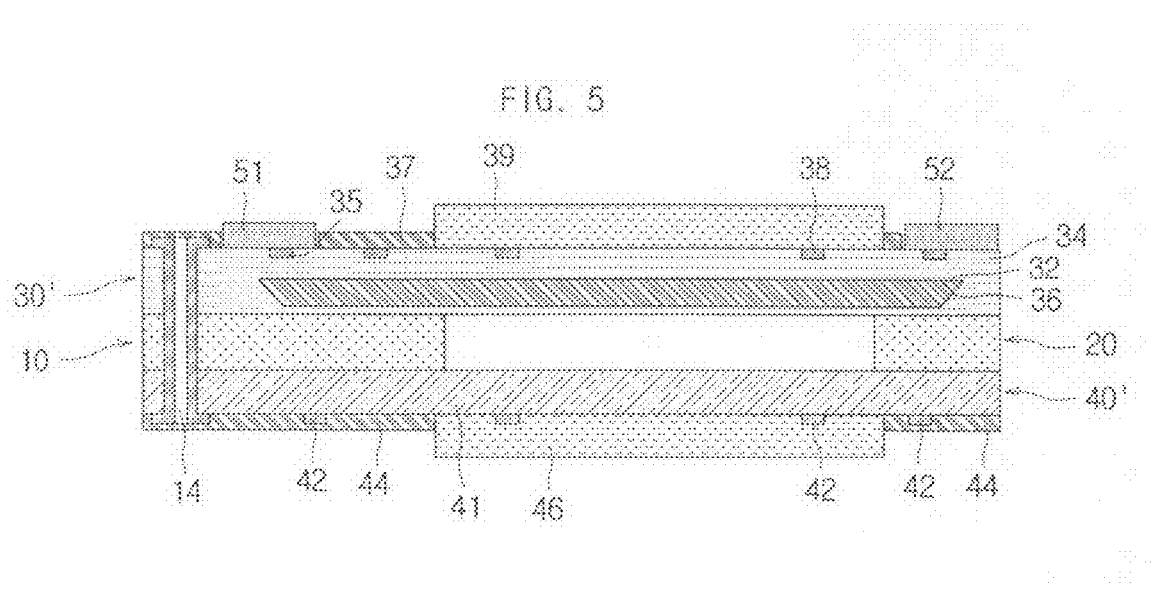
FIG. 5 is a cross-sectional view illustrating a printed circuit board according to a third disclosed embodiment of the invention.
Figure 6:
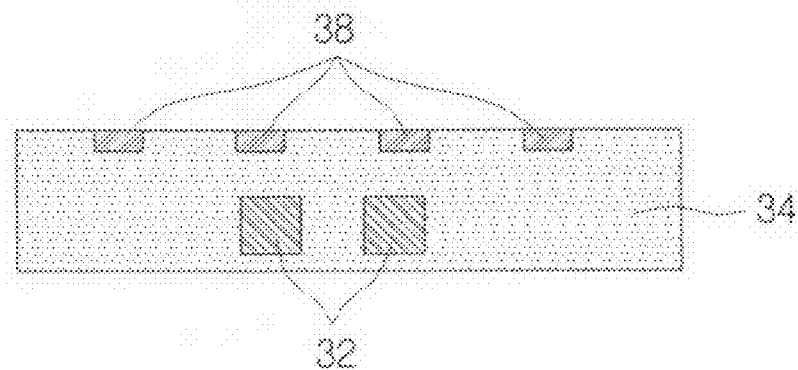
FIG. 6 is a cross-sectional view illustrating the flexible optical board from FIG. 5.

Next, a printed circuit board according to a third disclosed embodiment of the invention will be described as follows. FIG. 5 is a cross-sectional view illustrating a printed circuit board according to the third disclosed embodiment of the invention, and FIG. 6 is a cross-sectional view illustrating the flexible optical board from FIG. 5. In FIGS. 5 and 6 are illustrated a first board unit 10, a via 14, a second board unit 20, a flexible optical board 30', cores 32, a cladding 34, pads 35, solder resists 37, 44, circuit patterns 38, 42, cover lays 39, 46, a flexible electrical board 40', an insulation layer 41, and photoelectric converters 51, 52.

Detailed descriptions will not repeated for components that are substantially the same as those in the first and/or second disclosed embodiment, with the descriptions focusing mostly on different components.

In the printed circuit board according to this embodiment, a circuit pattern 38 that includes pads 35 may be buried in a flexible optical board 30', the flexible optical board 30' may be stacked on the outermost layers of the first board unit 10 and second board unit 20, and the photoelectric converters 51, 52 may be mounted directly on the flexible optical board 30'.

The longer the distance from the photoelectric converters 51, 52 to the core 32, the greater the risk of errors created by losses and crosstalk in the optical signals. In consideration of this, the structure is presented in which the circuit pattern 38 and pads 35 may be formed on the flexible optical board 30', and the photoelectric converters 51, 52 may be mounted directly on the flexible optical board 30'.

For unobstructed transmission of optical signals between the photoelectric converters 51, 52 and the core 32, the cladding 34 can be made of a transparent material.

For mounting the photoelectric converters 51, 52, portions of the circuit pattern 38, for example, the surfaces of the pads 35, can be exposed at the surface of the cladding 34. By having the portions of the pads 35 exposed as such at the surface, the photoelectric converters 51, 52 may be readily connected with the pads 35. FIG. 6 illustrates a structure in which cores 32 and the circuit pattern 38 are buried together in the cladding 34, but with one side of the circuit pattern 38 exposed at the surface of the cladding 34.

It is to be appreciated that such a structure, which has a circuit pattern 38 buried in the flexible optical board 30, but with portions of the circuit pattern 38 exposed at a surface of the cladding 34, can be applied not only to this embodiment but also to the first disclosed embodiment described above.

Figure 7:
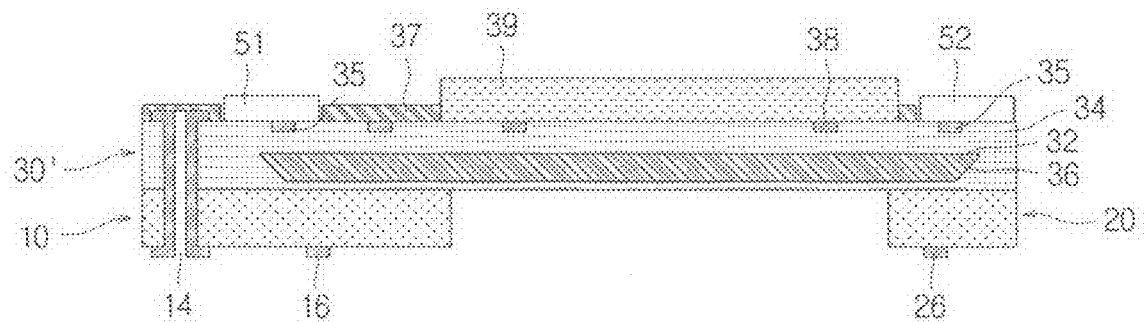
FIG. 7 is a cross-sectional view illustrating a printed circuit board according to a fourth disclosed embodiment of the invention.

Next, a printed circuit board according to a fourth disclosed embodiment of the invention will be described as follows. FIG. 7 is a cross-sectional view illustrating a printed circuit board according to the fourth disclosed embodiment of the invention. In FIG. 7, there are illustrated a first board unit 10, circuit patterns 16, 26, 38, a second board unit 20, a flexible optical board 30', a core 32, a cladding 34, pads 35, a solder resist 37, a cover lay 39, and photoelectric converters 51, 52.

Detailed descriptions will not repeated for components that are substantially the same as those in the previously disclosed embodiments, with the descriptions focusing mostly on different components.

The printed circuit board according to this embodiment can be structured such that it does not have a separate flexible electrical board, but instead may have a circuit pattern 38, which includes pads 35, formed in a flexible optical board 30', with photoelectric converters 51, 52 mounted directly on the flexible optical board 30'.

In order that the photoelectric converters 51, 52 may readily be mounted, the flexible optical board 30' can be stacked on the outermost layers of a first board unit 10 and second board unit 20.

This structure can obviate the need for a separate electrical board in transmitting electrical signals, so that manufacturing costs may be reduced, while the thickness of the printed circuit board can be decreased, to allow smaller sizes and higher densities.

Also, as already mentioned in the description for the third disclosed embodiment, by having the photoelectric converters 51, 52 mounted directly on the flexible optical board 30', the distance from the photoelectric converters 51, 52 to the core 32 can be minimized, so that the risk of errors created by losses and crosstalk in the optical signals may be lowered.

According to certain embodiments of the invention as set forth above, rigid boards and a flexible optical board may be formed as an integrated structure, to obviate the need for separate connectors and thus lower the cost of the product.

While the spirit of the invention has been described in detail with reference to particular embodiments, the embodiments are for illustrative purposes only and do not limit the invention. It is to be appreciated that those skilled in the art can change or modify the embodiments without departing from the scope and spirit of the invention.

Many embodiments other than those set forth above are encompassed within the scope of claims of the present invention.

What is claimed is:

1. A printed circuit board comprising:
a first board unit and a second board unit disposed with a gap in-between;
a flexible optical board having one side stacked on the first board unit and the other side stacked on the second board unit, the flexible optical board configured to transmit optical signals; and
a photoelectric converter mounted on the flexible optical board, wherein
the flexible optical board comprises a core through which the optical signals travel, a cladding surrounding the core, a circuit pattern, and a pad, the pattern and pad being buried in the cladding and configured to transmit electrical signals,
the pad is exposed at a surface of the cladding, and
the photoelectric converter is mounted on the pad so as to be directly connected with the pad.

2. The printed circuit board of claim 1, wherein the flexible optical board is stacked on an outermost portion of the first board unit.

3. The printed circuit board of claim 1, wherein the cladding is made of a transparent material.

4. The printed circuit board of claim 1, further comprising a flexible electrical board having one side stacked on the first board unit and the other side stacked on the second board unit, wherein the flexible optical board and the flexible electrical board are disposed with a gap in-between.

* * * * *